United States Patent [19]

Tustaniwskyj

[11] Patent Number: 4,506,941

[45] Date of Patent: Mar. 26, 1985

[54] SOCKET INCORPORATING SERIALLY COUPLED SPRINGS

[75] Inventor: Jerry I. Tustaniwskyj, Mission Viejo, Calif.

[73] Assignee: Burroughs Corporation, Detroit, Mich.

[21] Appl. No.: 554,316

[22] Filed: Nov. 23, 1983

[51] Int. Cl.³ .............................................. H01R 13/62
[52] U.S. Cl. ............................. 339/75 M; 339/17 CF; 339/74 R
[58] Field of Search ............. 339/17 CF, 74 R, 75 M, 339/176 M

[56] References Cited

U.S. PATENT DOCUMENTS

| | | | |
|---|---|---|---|
| 3,763,459 | 10/1973 | Millis | 339/75 M |
| 4,012,099 | 3/1977 | Worcester | 339/75 M |
| 4,331,371 | 5/1982 | Ichimura et al. | 339/74 R |
| 4,341,429 | 7/1982 | Bright et al. | 339/75 M |
| 4,343,524 | 8/1982 | Bright et al. | 339/75 M |
| 4,381,130 | 4/1983 | Sprenkle | 339/74 R |
| 4,397,512 | 8/1983 | Barraire et al. | 339/75 M |

FOREIGN PATENT DOCUMENTS 2557346  6/1976  Fed. Rep. of Germany ... 339/75 M

Primary Examiner—John McQuade
Attorney, Agent, or Firm—Charles J. Fassbender; Kevin R. Peterson

[57] ABSTRACT

A socket for an integrated circuit package comprises a frame; a plurality of mechanical contacts mounted in the frame such that they align with corresponding pins on the package; a contact deflecting member in the frame which is moved to engage and deflect the contacts against the pins; an actuator in the frame which is manually moved to engage and move the contact deflecting member; and a spring in the frame which engages and is deflected by the actuator when the actuator moves the contact deflecting member; the spring being mounted to deflect in series with the contacts to enable the recited socket components to have dimensional tolerances and yet avoid the overstressing and understressing of the contacts by the contact deflecting member.

11 Claims, 6 Drawing Figures

FIG. 4.

eq.1 ~ $F = C_1 \dfrac{[F_{nom} + k_{eff} k_B x]}{k_{eff} + k_B}$ eq.2 ~ $S = C_2 \dfrac{[F_{nom} + k_{eff} k_B x]}{k_{eff} + k_B}$

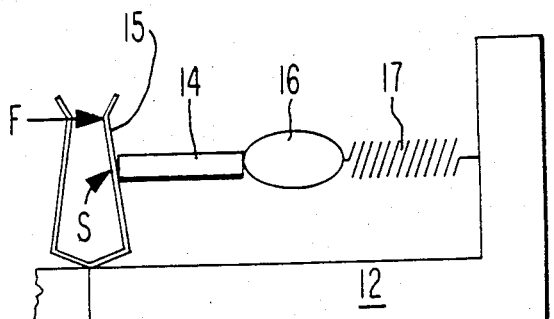

FIG. 5 Prior Art eq.1' ~ $F' = C_1 [F_{nom} + k_{eff} x]$ eq.2' ~ $S' = C_2 [F_{nom} + k_{eff} x]$

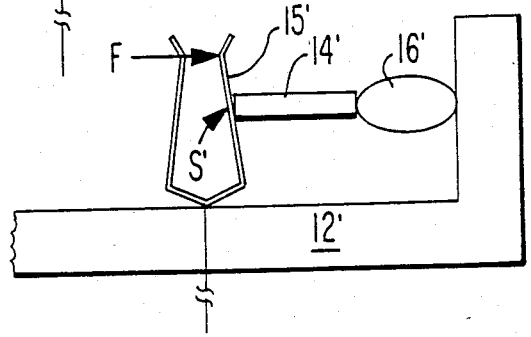

FIG. 6.

| | (Inches) | | | | (LBS/in) | (LBS) | (Kpsi) | (LBS) | (Kpsi) |
|---|---|---|---|---|---|---|---|---|---|
| N | t | ℓ | ω₁ | ω₂ | $k_B$ | $F_{min}$ | $S_{max}$ | $F'_{min}$ | $S'_{max}$ |
| 72 | 0.050 | 0.860 | 0.080 | 0.225 | 36.11 | 0.23 | 162 | | |
| 88 | 0.064 | 1.060 | 0.080 | 0.225 | 33.09 | 0.23 | 160 | | |
| 144 | 0.081 | 1.260 | 0.100 | 0.225 | 27.61 | 0.24 | 156 | 0.05 | 238 |
| 208 | 0.102 | 1.460 | 0.125 | 0.300 | 29.63 | 0.23 | 159 | | |
| 280 | 0.128 | 1.660 | 0.160 | 0.300 | 30.88 | 0.23 | 159 | | | eq.3 ~ $k_B = \left(\dfrac{1}{N}\right) \dfrac{aEt^3}{3\left\{\dfrac{\ell^2}{4} + \left(\dfrac{2\omega_2}{a} - \ell\right)\left[\left(\dfrac{\ell}{2} - \dfrac{\omega_2}{a}\right)\ln\left(1 - \dfrac{a\ell}{2\omega_2}\right) - \dfrac{\ell}{2}\right]\right\}}$ , $a = \dfrac{2(\omega_2 - \omega_1)}{\ell}$ eq.4 ~ $E = 18 \times 10^6 \, psi$, $C_1 = 0.588$, $C_2 = 254.7 \, Kpsi/LB$, $F_{NORM} = 0.5 \, LBS$, $k_{eff} = 85 \, LB/in$.

SOCKET INCORPORATING SERIALLY COUPLED SPRINGS

BACKGROUND OF THE INVENTION

This invention relates to sockets for connecting integrated circuit packages to an electrical system; and more particularly, it relates to zero insertion force sockets.

An integrated circuit package consists essentially of an integrated circuit chip which has leads attached to bonding pads on the chip and which is encapsulated in a protective media. Typically, the system to which the integrated circuit package is to be connected is contained on one or more printed circuit boards.

In some systems, the integrated circuit package is soldered directly to the printed circuit board to thereby completely eliminate the use of a socket. However, such a direct solder connection is undesirable in that it makes the task of replacing a defective integrated circuit package on the circuit board relatively difficult.

By comparison, when the integrated circuit package is connected to the board by means of a zero insertion force socket, the socket is soldered to the board, and the package is held in the socket by some mechanical mechanism. That mechanism has one operating position which holds the socket contacts securely against the package leads, and it has another operating position which releases the package from the socket.

However, a major problem with a zero insertion force socket is that each of the mechanical components of the socket must be allowed some dimensional tolerance in order to make the socket manufacturable. And those dimensional tolerances cause the force with which the package is held in the socket to vary.

Particular care must be taken to ensure that the force with which the integrated circuit package is held does not become so large that the contacts in the socket permanently deform. On the other hand, care must be taken to ensure that the force with which the package is held in the socket does not become so small that good electrical connection between the package leads and the socket contacts is not made.

Further, the above problems must be solved while maintaining a small spacing between the socket contacts. Otherwise the socket would be too large and would occupy too much space on the printed circuit board.

Accordingly, a primary object of the invention is to provide an improved zero insertion force socket for holding an integrated circuit package.

Still another object of the invention is to provide a zero insertion force socket which does not overstress or understress the socket contacts despite the presence of dimensional tolerances in the socket components.

BRIEF SUMMARY OF THE INVENTION

These objects and others are achieved in accordance with the invention by a socket for an integrated circuit package which is comprised of a frame, a plurality of mechanical contacts having a spring rate $K_{eff}$ mounted in the frame such that they align with corresponding pins in the package, a contact deflecting member in the frame which is moved to engage and deflect the contacts against the pins, an actuator in the frame which is manually moved to move the contact deflecting member from an open position where each contact is not deflected against the pin to a closed position where each contact is nominally deflected against the pin with a nominal force $F_{nom}$, and a spring in the frame having a per contact spring rate of $K_B$ which engages and is deflected by the actuator, the spring being mounted to deflect in series with the contact so that the force with which each contact pushes against the pin in the closed position is proportional to $F_{nom} + K_{eff} K_B (K_{eff} + K_B)^{-1} X$ where X is the cumulative dimensional tolerance of the components in the socket.

BRIEF DESCRIPTION OF THE DRAWINGS

Various features and advantages of the invention are described in detail in the Detailed Description in conjunction with the accompanying drawings wherein:

FIG. 4 is a schematic diagram illustrating the operation of the FIG. 1 embodiment;

FIG. 5 is a schematic diagram illustrating the operation of a prior art connector;

FIG. 6 is a table which contains a numerical comparison of the FIG. 4 and FIG. 5 embodiments.

DETAILED DESCRIPTION OF THE INVENTION

Figure 1:
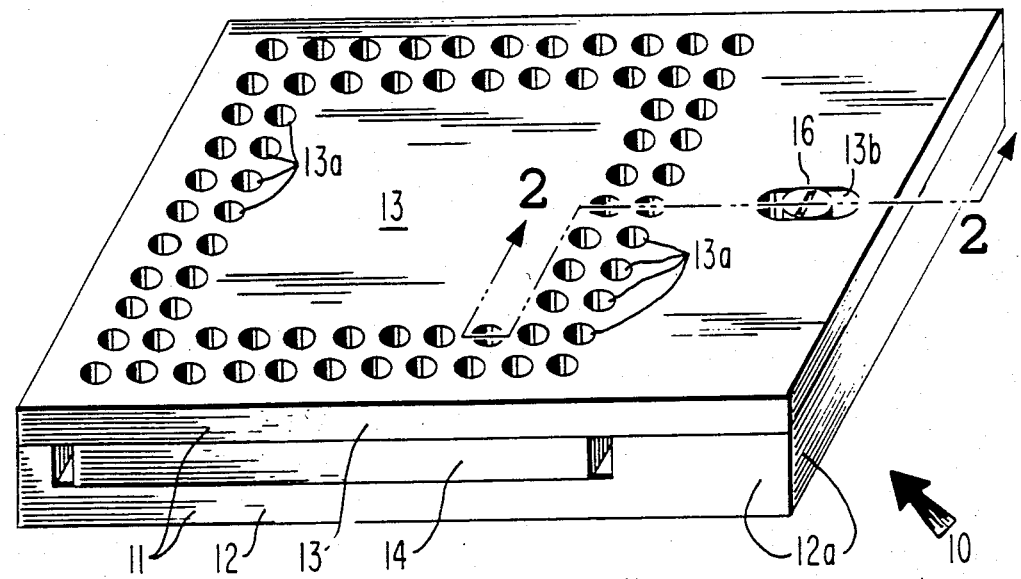
FIG. 1 is a pictorial view of one preferred embodiment of the invention.
Figure 2:
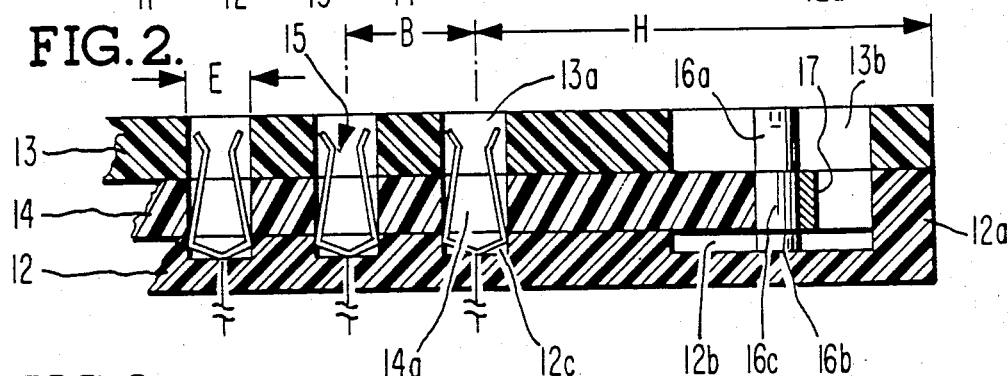
FIG. 2 is a cross-sectional view taken along lines 2—2 in FIG. 1.
Figure 3:
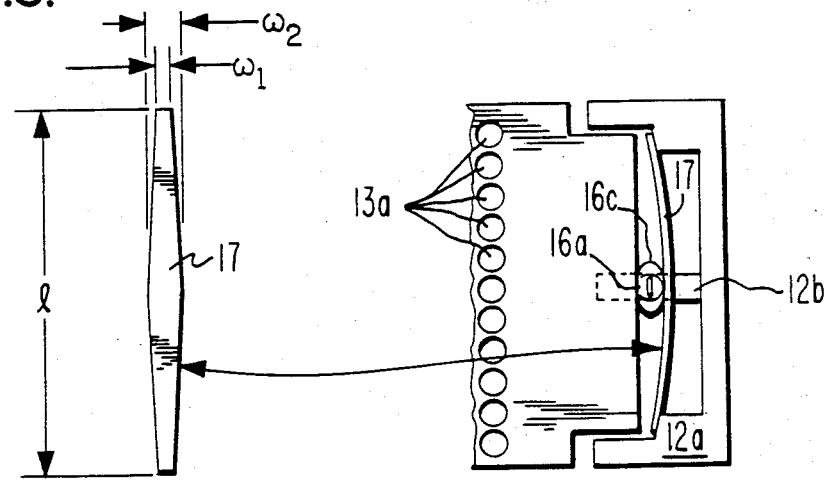
FIG. 3 is a top plan view of some of the components in the FIG. 1 embodiment.

Referring now to FIGS. 1, 2 and 3, a preferred embodiment, and variations thereof, of a zero insertion force socket 10 which is constructed according to the invention will be described in detail.

Socket 10 is comprised of a frame 11 which in turn is made of a base plate 12 and a top plate 13. Plate 13 is planar and it has a rectangular shape. Plate 13 also has a plurality of holes 13a which are arranged in an array such that they align with corresponding pins on the integrated circuit package (not shown) that is to be held in the socket.

Preferably, the space between the holes 13a is very small (i.e., no more than 0.125 inches). This enables socket 10 to receive an integrated circuit package that has a large number of pins and yet occupies a small area. In one preferred embodiment, the holes 13a are 0.057 inches in diameter and they are arranged on 0.100 inch centers.

Preferably, the total number of holes 13a is selected from the set of 72, 88, 144, 208, and 280. In FIG. 2, a 72-hole socket is illustrated. To obtain an 88, 144, 208 and 280 hole socket, the number of holes per side in the hole array respectively is 13, 15, 17, and 19. Also the number of rows in each side of the hole array for the 144, 208 and 280 hole socket respectively is 3, 4 and 5.

Considering now the base plate 12, it has a rectangular shape that coincides with the top plate 13. That portion of base plate which underlies the holes 13a is planar. But the front portion 12a of base plate 12 and two rear corners of base plate 12 rise up and make contact with the top plate 13 at its perimeter. Thus a passage is formed between base plate 12 and top plate 13.

Socket 10 also includes a cam plate 14. Plate 14 is planar; and it is shaped to fit and slide in the passage that exists between the base plate and top plate. Plate 14 also has a plurality of holes 14a which are patterned to align with the holes 13a in the top plate. Further, base plate 12 has a plurality of holes 12c which go only partway through the base plate 12 and are patterned to align with the holes 13a and 14a.

Each of the aligned holes 12c, 13a, and 14a contains a mechanical contact 15. The top portion of contact 15 is U-shaped; and the pin of an integrated circuit package (not shown) fits between the legs of the "U". In operation, cam plate 14 slides between top plate 13 and base plate 12 to engage and deflect the right leg of contact 15 against the integrated circuit pin.

An actuator mechanism, such as a cam 16, is mounted in frame 10 as a means for moving cam plate 14. Cam 16 has two circular end portions 16a and 16b and an elliptical central portion 16c. Portion 16a fits into a slot 13b in top plate 13; and portion 16b fits into another slot 12b in base plate 12.

Also, a spring 17 is provided in socket 10 to push cam 16 against cam plate 14. Preferably, spring 17 is a planar elongated metal strip having a length l, a relatively narrow width $\omega1$ at its ends, and a relatively wide width $\omega2$ at its center.

Spring 17 is held in place at its ends by the elevated portion 12a of base plate 12; and spring 17 pushes against cam 16 at its center. Thus, when cam 16 is rotated to push cam plate 14 against the contacts 15, the cam plate 14 is moved in one direction while spring 17 deflects in the opposite direction. At the same time, cam 16 moves transversely in the slots 12b and 13b by a distance which is determined by the balance of forces on cam 16.

Spring 17 is of critical importance because it enables all of the above-recited components of socket 10 to have various dimensional tolerances and yet avoid the overstressing and understressing of the contacts 15 when they are moved by the cam plate 14 to their closed position. How spring 17 accomplishes this will now be explained in conjunction with FIGS. 4, 5, and 6.

In one preferred embodiment, components 12, 13 and 14 are made of plastic. Also, cam 16 is made of zinc alloy; and contact 15 and spring 17 are made of BeCu. Other suitable materials can also be used to form these components.

Reference should now be made to FIG. 4 which shows the manner in which contact 15 is forced against an integrated circuit package pin. As there illustrated, cam 16 pushes cam plate 14 in one direction and deflects spring 17 in an opposite direction. In turn, cam plate 14 causes contact 15 to push against the integrated circuit pin with a force F which can be expressed mathematically as:

$$F = C_1[F_{nom} + K_{eff}K_B(K_{eff}+K_B)^{-1}X] \sim eq.1.$$

In equation 1, the term $F_{nom}$ is the nominal force with which cam plate 14 pushes against contact 15. This nominal force occurs when all of the components in the socket 10 have their nominal physical dimensions. However, in order to manufacture the socket, each socket component must be allowed some dimensional tolerance. In equation 1, the combined dimensional tolerance of all of the components is represented by the variable X.

Listed below is a table of the components in socket 10 along with suitable nominal dimensions and tolerance for each component. These table entries are labeled A through J; and each entry is in inches. For example, entry D says that the hole-to-hole spacing in base plate 12 has a nominal value of 0.100 inches and it has a tolerance of plus or minus 0.002 inches. Only items B, E, and H are illustrated in FIG. 2 in order to not clutter the drawing.

TABLE 1

| | dimension | nominal value & tolerance |
|---|---|---|
| (A) | small diameter of cam 16 | 0.192 ± 0.001 |
| (B) | center to center spacing of holes in top plate 13 | 0.100 ± 0.002 |
| (C) | center to center spacing of holes in cam plate 14 | 0.100 ± 0.002 |
| (D) | center to center spacing of holes in base plate 12 | 0.100 ± 0.002 |
| (E) | diameter of holes in top plate 13 | 0.057 ± 0.002 |
| (F) | diameter of holes in cam plate 14 | 0.042 ± 0.001 |
| (G) | diameter of holes in base plate 12 | 0.017 ± 0.001 |
| (H) | distance from front of top plate 13 to center of front row of holes | 0.275 ± 0.002 |
| (I) | distance from front of cam plate 14 to center of front row of holes | 0.117 ± 0.001 |
| (J) | distance from front of base plate to center of front row of holes | 0.275 ± 0.002 |

Additional terms in equation 1 are "$C_1$", "$K_{eff}$", and "$K_B$". Term $C_1$ is merely a proportionality constant which relates the force that is exerted by cam plate 14 on contact 15 to the force F that is exerted by contact 15 against the integrated circuit pin. Term $K_{eff}$ is the spring rate constant of contact 15 when it is pushed at the point where cam plate 14 pushes against contact 15. And term $K_B$ is the per contact spring rate of spring 17.

In equation 1, the product term $K_{eff}K_B(K_{eff}+K_B)^{-1}$ is the equivalent spring rate which is obtained when two separate springs having respective spring rates of $K_{eff}$ and $K_B$ are connected in series. Such a series connection does in fact exist in connector 10. This is evident by inspection of FIG. 4 which shows that both contact 15 and spring 17 deflect in series with one another when cam 16 is rotated.

Similarly, an equation for the stress S which occurs in contact 15 at the point where cam plate 14 engages contact 15 can be written as:

$$S_M = C_2[F_{nom} + (K_{eff}K_B)(K_{eff}+K_B)^{-1}X] \sim eq.2.$$

In equation 2, the parameter $C_2$ is a proportionality constant while the terms $F_{nom}$, $K_{eff}$, $K_B$, and X are as defined above.

Inspection of equation 2 shows that the stress S is proportional to the product term $K_{eff}K_B(K_{eff}+K_B)^{-1}$. And as stated above, that term is the equivalent spring rate of two serially connected springs having respective spring rates of $K_{eff}$ and $K_B$.

For comparison purposes, FIG. 5 shows a schematic diagram of a prior art connector which has no backplate spring 17. Instead, a cam 16' is provided which pushes against a cam plate 14' and a base plate 12', the latter of which does not move. In turn, the cam plate 14' pushes against a contact 15' which causes the contact to exert a force F' against the pin of the integrated circuit package.

That force F' is expressed mathematically as:

$$F' = C_1[F_{nom} + K_{eff}X] \sim eq.1'.$$

Inspection of equation 1' shows that the force F' is proportional to the spring rate $K_{eff}$ times the displacement X of cam plate 14 from its nominal position. This is significant because the term $K_{eff}$ will always be larger than the product term $K_{eff}K_B(K_{eff}+K_B)^{-1}$ so long as the terms $K_{eff}$ and $K_B$ are positive numbers.

Since the term $K_{eff}$ is larger than $K_{eff}K_B(K_{eff}+K_B)^{-1}$, it follows that force F' will always be less than the force F for any given negative tolerance X in the physical dimensions. Thus, the overall negative physical tolerances X must be more closely controlled in the FIG. 5 socket than in the FIG. 4 socket. Otherwise, when the physical tolerances X are large and negative, the contact will be understressed. That is, the contact will not be pushed by the cam plate against the integrated circuit pin with a force that is sufficiently large to ensure a good electrical connection.

Similarly, equation 2' in FIG. 5 gives an expression for the stress S' which occurs in the contact 15' at the point where cam plate 14' engages contact 15'. Inspection of equation 2' shows that this stress is proportional to the term $K_{eff}$ rather than the product $K_{eff}K_B(K_{eff}+K_B)^{-1}$. Therefore, the stress S' will always be larger than the stress S for any given positive tolerance X in the physical dimensions. And so the positive tolerance X must be more closely controlled in the FIG. 5 socket than in the FIG. 4 socket to avoid overstressing and permanently deforming the contacts.

Consider now FIG. 6 wherein a table lists several numerical examples of the minimum forces and maximum stresses that occur in the sockets of FIGS. 4 and 5. In this table, the leftmost column "N" lists the number of contacts in the socket. Then the next column "t" indicates the thickness of spring 17.

Next, the column "l" indicates the length of spring 17. Then, a pair of columns "ω1" and "ω2" respectively list the two widths of spring 17. Then a column $K_B$ lists the per contact spring rate of spring 17 given the parameters of the preceding columns. This spring rate is calculated from a formula in FIG. 6 which is labeled equation 3.

Next, a column "$F_{min}$" lists the force F with which contact 15 would push against a pin of an integrated circuit package under the conditions where the overall tolerance X of all of the physical dimensions is −0.005 inches. Entries in this column are obtained by utilizing equation 1 along with the $K_B$ parameters listed in column "$K_B$" and the other parameters listed as equation 4.

Similarly, the next column "$S_{MAX}$" lists the maximum stress which occurs when the overall tolerance X in the physical dimensions is +0.005 inches. Stress $S_{MAX}$ is calculated using equation 2 under the conditions of column "$K_B$" and equation 4.

For comparison purposes, the last two columns in FIG. 6 give the minimal force $F'_{MIN}$ and maximum stress $S'_{MAX}$ which occur in the FIG. 5 connector. Force $F'_{MIN}$ is calculated using equation 1' with the overall dimensional tolerance X is set at −0.005 inches; and the stress S' is calculated using equation 2' with the overall dimensional tolerance set at +0.005 inches. In making these calculations, the parameters of equation 4 are again applied.

Inspection of the columns $F_{MIN}$, $S_{MAX}$, $F'_{MIN}$, and $S'_{MAX}$ in FIG. 6 clearly shows the superiority of the disclosed socket over the prior art. For example, when the disclosed socket has 88 contacts and a dimensional tolerance of +0.005 inches, the stress $S_{MAX}$ is only 160 KPSI; whereas under the same conditions, the FIG. 5 prior art socket has a stress $S'_{MAX}$ of 238 KPSI. That latter stress is sufficiently large to permanently deform the contacts in the socket since BeCu begins to permanently deform at a stress of 165 KPSI.

As another example, when the disclosed socket has 88 contacts and the overall dimensional tolerances of all of the socket components is −0.005 inches, then the minimal force with which the contact pushes against the pin and the integrated circuit is 0.23 pounds. But by comparison, when the FIG. 5 prior art socket is subjected to the same conditions, the contact pushes against the pin of the integrated circuit package with only 0.05 pounds. This force is not large enough to make a good electrical connection between the contact and the pin of the integrated circuit.

As a supporting argument for the FIG. 5 prior art socket, the point can be advanced that force $F'_{MIN}$ and stress $S'_{MAX}$ can be made less sensitive to the dimensional tolerances X simply by forming contact 15' such that the term $K_{eff}$ is reduced. However, the force $F_{nom}$ in equations 1 and 1' is equal to the term $K_{eff}$ times the nominal displacement of the contact. Therefore, if $K_{eff}$ is reduced in size, the nominal displacement of contact 15 must increase in size by a corresponding amount in order to maintain the same nominal force.

But increasing the nominal displacement of contact 15' is highly undesirable since to do so would require that the space between adjacent contacts be increased; and that in turn would require that the overall size of the socket be increased. Thus, the number of sockets that could fit into a given area of a printed circuit board would be reduced.

Various preferred embodiments of the invention have now been described in detail. In addition, however, many changes and modifications can be made to these details without departing from the nature and spirit of the invention. For example, a relatively stiff wear plate can be attached to that edge of cam plate 14 which makes contact with cam 16. This would prevent cam plate 14 from distorting at the point where it is pushed by cam 16.

Accordingly, since many such changes and modifications can be made to the above details without departing from the nature and spirit of the invention, it is to be understood that the invention is not limited to said details but is defined by the appended claims.

What is claimed is:

1. A socket for an integrated circuit package, comprising:
   a frame;
   a plurality of mechanical contacts having a spring rate $K_{eff}$ mounted in said frame such that they align with corresponding pins on said package;
   a contact deflecting member in said frame which is moved to engage and deflect said contacts against said pins;
   an actuator in said frame which is manually moved to move said contact deflecting member from an open position where each contact is not deflected against a pin to a closed position where each contact is nominally deflected against a pin by a nominal force $F_{nom}$; and
   a spring in said frame having a per contact spring rate of $K_B$ which engages and is deflected by said actuator;
   said spring being mounted to deflect in series with said contacts so that the force with which each contact pushes against a pin in said closed position is proportional to $F_{nom} + K_{eff}K_B(K_{eff} + K_B)^{-1}X$ where X is the cumulative dimensional tolerance of the components in said socket.

2. A socket according to claim 1 wherein said actuator moves said contact deflecting member in one direction to deflect said contacts against said pins, and simultaneously, said actuator deflects said spring in an opposite direction.

3. A socket according to claim 1 wherein said spring has an elongated shape and is held in place at its ends by said frame while said actuator engages and deflects said spring at its center.

4. A socket according to claim 1 wherein said spring is wide at its center and narrow at its ends.

5. A socket according to claim 1 wherein said spring has a per contact spring rate that is relatively small and each contact has a spring rate that is relatively large.

6. A socket according to claim 1 wherein said actuator is a cam.

7. A socket according to claim 1 wherein said mechanical contacts are mounted in said frame in a gridlike pattern on centers of no more than 0.125 inches.

8. A socket according to claim 1 wherein the number of contacts in said plurality is selected from the set of 68, 72, 144, 208, and 280.

9. A socket according to claim 1 wherein said contact deflecting member is a plate having a plurality of holes through which said contacts respectively fit and engage the sidewalls thereof.

10. A socket according to claim 1 wherein said contact deflecting member has a relatively low modulus of elasticity except for a section thereof that is pushed by said actuator which has a relatively high modulus of elasticity.

11. An improved socket for an integrated circuit package including a frame; a plurality of mechanical contacts mounted in said frame such that they align with corresponding pins on said package; a contact deflecting member in said frame which is moved to engage and deflect said contacts against said pins; and an actuator in said frame which is manually moved to engage and move said contact deflecting member; wherein the improvement comprises:

a spring in said frame which engages and is deflected by said actuator when said actuator moves said contact deflecting member;

said spring being mounted to deflect in series with said contacts to enable the recited socket components to have dimensional tolerances and yet avoid the overstressing and understressing of said contacts by said contact deflecting member.

* * * * *